US012739971B2

(12) United States Patent
Li

(10) Patent No.: US 12,739,971 B2
(45) Date of Patent: Sep. 15, 2026

(54) SHEET METAL WATERPROOF DESIGN FOR FLEX SEALING

(71) Applicant: Google LLC, Mountain View, CA (US)

(72) Inventor: Chienkuan Li, Taoyuan City (TW)

(73) Assignee: Google LLC, Mountain View, CA (US)

( * ) Notice: Subject to any disclaimer, the term of this patent is extended or adjusted under 35 U.S.C. 154(b) by 199 days.

(21) Appl. No.: 18/887,648

(22) Filed: Sep. 17, 2024

(65) Prior Publication Data

US 2026/0082478 A1 Mar. 19, 2026

(51) Int. Cl.
*H05K 1/02* (2006.01)
*H05K 1/11* (2006.01)
*H05K 1/14* (2006.01)
*H05K 5/02* (2006.01)

(52) U.S. Cl.
CPC ............. *H05K 1/028* (2013.01); *H05K 1/118* (2013.01); *H05K 1/148* (2013.01); *H05K 5/0226* (2013.01)

(58) Field of Classification Search
CPC ........ H05K 1/028; H05K 1/118; H05K 1/148; H05K 5/0226; G06F 1/1616; G06F 1/1681; G06F 1/1652
See application file for complete search history.

(56) References Cited

U.S. PATENT DOCUMENTS

2013/0215567 A1* 8/2013 Morita .................. G06F 1/1637 361/679.55
2017/0194411 A1 7/2017 Park et al.
2020/0233464 A1* 7/2020 Lee ....................... G06F 1/1652
2021/0286407 A1 9/2021 Kim et al.
2023/0126247 A1* 4/2023 Yoon ..................... G06F 1/1681 361/679.27
2023/0156944 A1 5/2023 Park et al.
2024/0121330 A1 4/2024 Lombardi et al.
2024/0210235 A1* 6/2024 Sahni ..................... G01G 19/44

FOREIGN PATENT DOCUMENTS

WO 2022097940 A1 5/2022
WO 2022257582 A1 12/2022

* cited by examiner

*Primary Examiner* — Paresh Paghadal

(74) *Attorney, Agent, or Firm* — Shumaker & Sieffert, P.A.

(57) ABSTRACT

An example foldable display sub-assembly includes a first assembly and a second assembly. The example foldable display sub-assembly further includes a hinge mechanism attached between the first assembly and the second assembly and a flexible display. The example foldable display sub-assembly further includes a flex cable that runs between the first assembly and the second assembly, and a flex cable holder attached to an internal portion of the first assembly and to a first side of the flex cable. The example foldable display sub-assembly further includes a fixer component that includes one or more hooks matingly engaged within the internal portion of the first assembly. The example foldable display sub-assembly further includes an adhesive filler applied to a space between the flex cable holder, the fixer component, the flex cable, and at least part of the internal portion of the first assembly.

20 Claims, 7 Drawing Sheets

ATTACH A FLEX CABLE HOLDER TO AN INTERNAL PORTION OF A FIRST ASSEMBLY AND TO A FIRST SIDE OF A FLEX CABLE, WHERE THE FLEX CABLE RUNS THROUGH A HINGE MECHANISM ATTACHED BETWEEN THE FIRST ASSEMBLY AND A SECOND ASSEMBLY THAT ARE ASSEMBLIES OF A FOLDABLE DISPLAY ASSEMBLY

400

ATTACH A FIXER COMPONENT THAT INCLUDES ONE OR MORE HOOKS AS ABUTTING A SECOND SIDE OF THE FLEX CABLE OPPOSITE THAT OF THE FIRST SIDE, WHERE ATTACHING INCLUDES MATINGLY ENGAGING THE ONE OR MORE HOOKS WITHIN THE INTERNAL PORTION OF THE FIRST ASSEMBLY

402

APPLY AN ADHESIVE FILLER TO A SPACE BETWEEN THE FLEX CABLE HOLDER, THE FIXER COMPONENT, AND AT LEAST PART OF THE INTERNAL PORTION OF THE FIRST ASSEMBLY

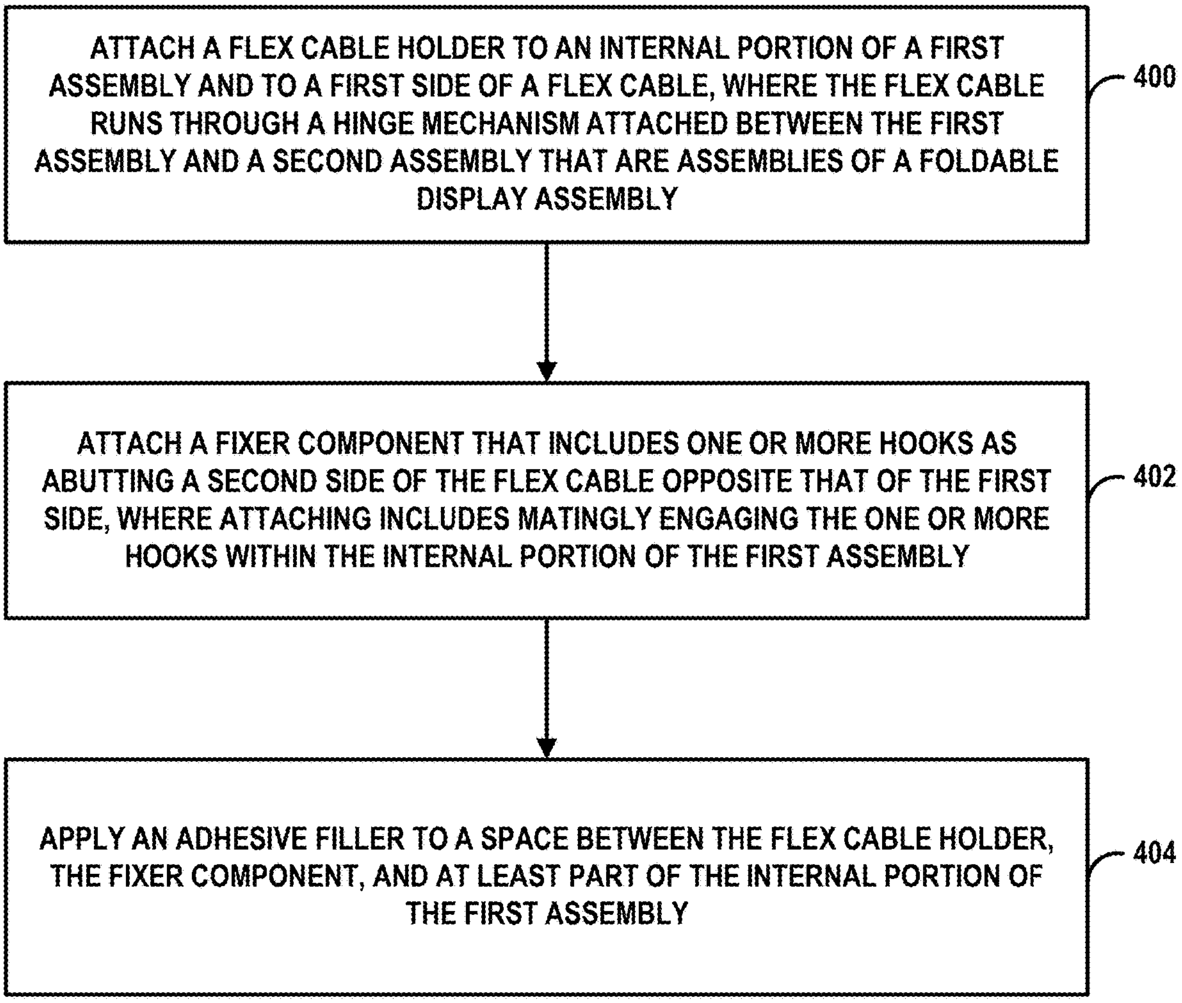

FIG. 4

SHEET METAL WATERPROOF DESIGN FOR FLEX SEALING

BACKGROUND

Devices that include displays may be referred to as display devices. In general, it may be desirable to increase the size of a display (e.g., the area on which images are displayed) as much as possible. One way to increase the size of a display without negatively affecting the portability of the device is to make the device collapsible such that the display can be folded (e.g., in half). Assembly of such a device with a foldable display may include attaching a cover to a hinge mechanism of the device.

SUMMARY

Foldable computing devices may include foldable displays that are "folded" or otherwise collapsed by way of a hinge mechanism. The hinge mechanism may include a number of relatively small and delicate components that facilitate the folding of the foldable device, such as springs, tabs, screws, and other components, and that require protection from potential sources of damage, such as intrusion by dust and water, small particles, and other items. In addition, foldable computing devices may include a flex cable that communicatively connects components in the two "halves" or assemblies of the foldable device and that passes through the hinge mechanism. Such a flex cable may be relatively delicate and require protection by the components of the hinge mechanism. For instance, repeated flexing of the flex cable may result in damage to the cable.

In accordance with one or more aspects of this disclosure, a foldable display sub-assembly includes flex cable holder attached to a flex cable, a fixer component that is matingly engaged to an assembly of the folding device, and an adhesive filler applied to a space within the foldable computing device. The flex cable holder may be attached to a side of the flex cable and provide support for the flex cable within the foldable display sub-assembly, as well as guide the flex cable. The fixer component may abut an opposite side of the flex cable from the flex cable holder and assist the flex cable holder in guiding the flex cable. For instance, the flex cable holder and the fixer component may "sandwich" the flex cable between themselves in at least part of the foldable display sub-assembly. In addition to the flex cable holder and the fixer component, the foldable display sub-assembly includes an adhesive filler applied to space between components of the foldable display sub-assembly. For instance, the adhesive filler may occupy a space between the flex cable holder, the fixer component, the flex cable itself, and other components of the foldable display sub-assembly. The use of the flex cable holder, the fixer component, and the adhesive filler may enable water and dust resistance of the foldable display sub-assembly without requiring a costly and complex waterproof frame, as well as increase the available volume within the foldable display sub-assembly by removing the need for additional water- and dust-proofing components. Further, the use of the flex cable holder, the fixer component, and the adhesive filler may simplify assembly and disassembly processes of the foldable display sub-assembly and further reduce costs.

In an example, a foldable display assembly, includes a first assembly; a second assembly; a hinge mechanism attached between the first assembly and the second assembly; a flexible display connected to the first assembly and the second assembly, the flexible display spanning the hinge mechanism; a flex cable that runs between the first assembly and the second assembly through the hinge mechanism; a flex cable holder attached to an internal portion of the first assembly and to a first side of the flex cable; a fixer component that includes one or more hooks matingly engaged within the internal portion of the first assembly, wherein the fixer component abuts a second side of the flex cable opposite that of the first side; and an adhesive filler applied to a space between the flex cable holder, the fixer component, the flex cable, and at least part of the internal portion of the first assembly.

In another example, a method includes attaching, by an assembler, a flex cable holder to an internal portion of a first assembly of a first assembly and to a first side of a flex cable, wherein the flex cable runs through a hinge mechanism attached between the first assembly and a second assembly that are assemblies of a foldable display assembly; attaching, by the assembler, a fixer component that includes one or more hooks as abutting a second side of the flex cable opposite that of the first side, wherein attaching include matingly engaging the one or more hooks within the internal portion of the first assembly; and applying, by the assembler, an adhesive filler to a space between the flex cable holder, the fixer component, and at least part of the internal portion of the first assembly.

In yet another example, kit for securing a flex cable within a foldable display assembly includes a first assembly; a second assembly; a flexible display spanning at least a portion of the first assembly and a portion of the second assembly; a hinge mechanism attached between the first assembly and the second assembly; a flex cable that run between the first assembly and the second assembly through the hinge mechanism; a flex cable holder to be attached to an internal portion of the first assembly and to a first side of the flex cable; a fixer component that includes one or more hooks positioned to matingly engage within the internal portion of the first assembly and to cause the fixer component to abut a second side of the flex cable opposite that of the first side; and an adhesive filler to be applied to a space between the flex cable holder, the fixer component, the flex cable, and at least part of the internal portion of the first assembly.

The details of one or more examples are set forth in the accompanying drawings and the description below. Other features, objects, and advantages of the disclosure will be apparent from the description and drawings, and from the claims.

BRIEF DESCRIPTION OF DRAWINGS

FIG. 4 is a flow chart illustrating an assembly of a folding device, in accordance with one or more aspects of this disclosure.

DETAILED DESCRIPTION

Figure 1A:
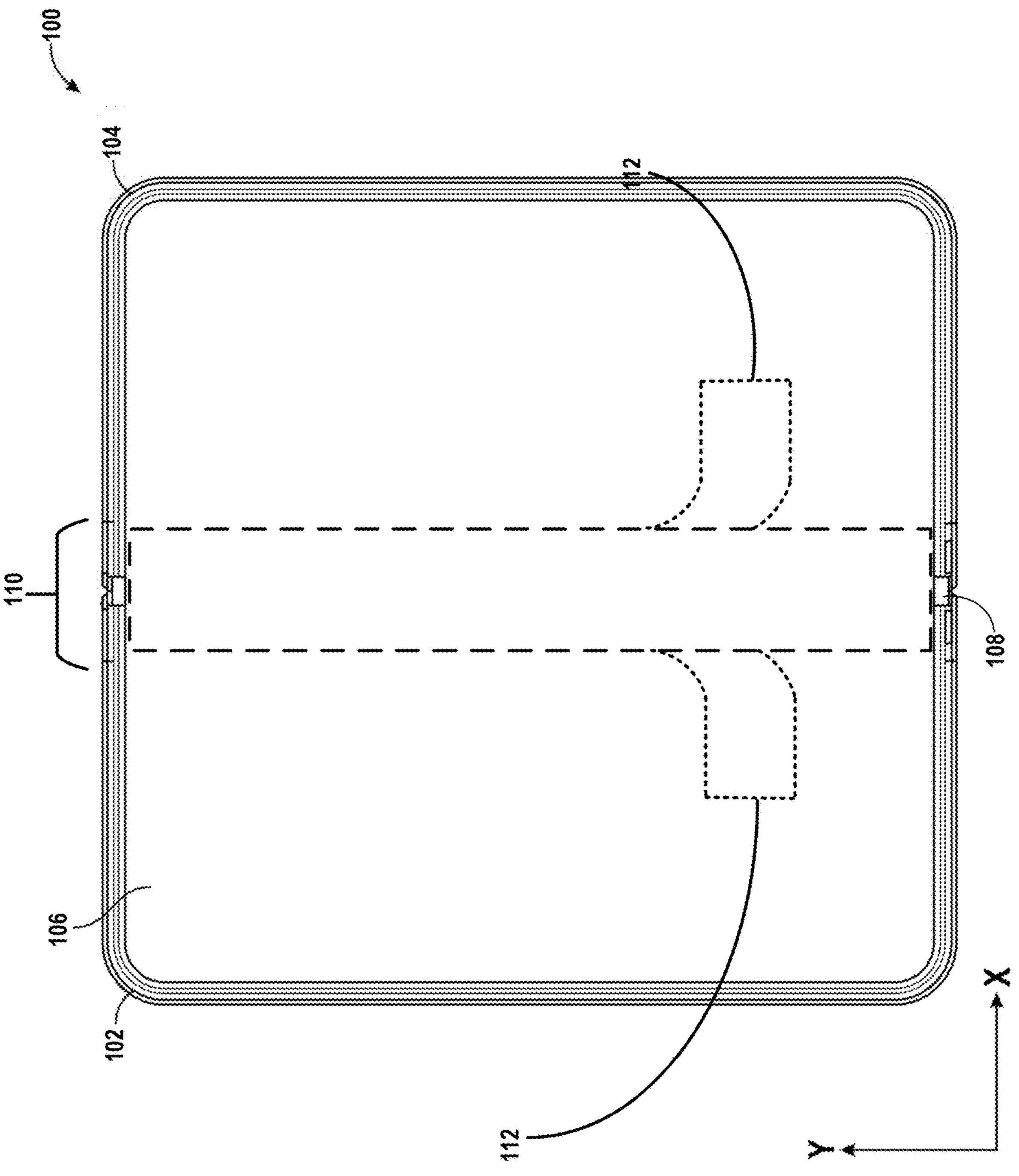
FIGS. 1A and 1B are schematic diagrams illustrating folding devices with a folding continuous display, in accordance with one or more aspects of this disclosure.
Figure 1B:
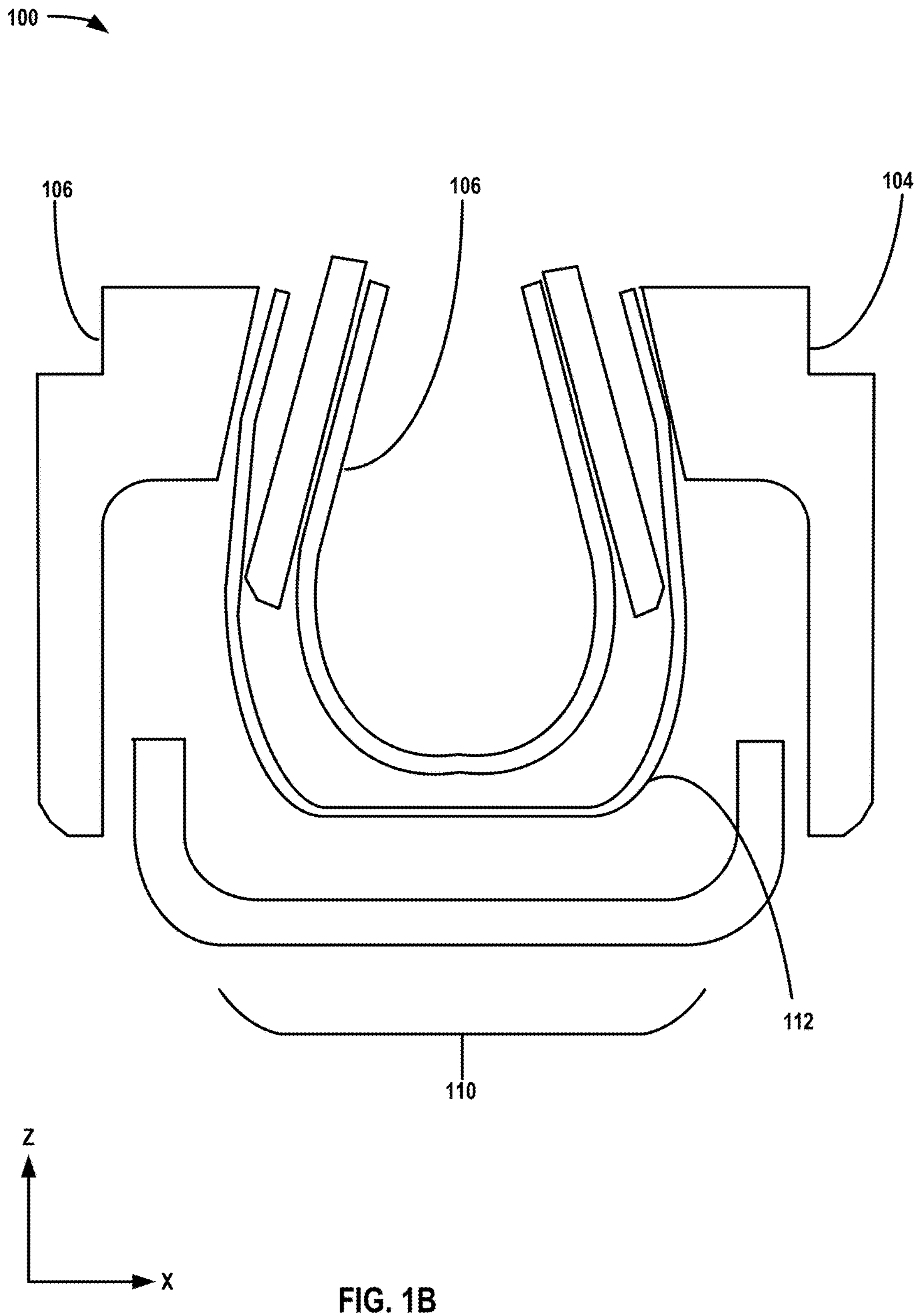

FIGS. 1A and 1B are schematic diagrams illustrating a folding device 100 with a folding continuous display, in accordance with one or more aspects of this disclosure. FIGS. 1A and 1B illustrate folding device 100 from different perspectives and physical states (e.g., "open" vs. "closed"). Examples of folding device 100 include foldable computing devices such as foldable smart phones, foldable tablets, foldable e-readers, foldable gaming systems, or any other foldable portable device.

FIG. 1A is a schematic diagram illustrating a folding device 100 with a folding continuous display 106 from a z-axis perspective and in an "open" or "unfolded" state. As shown in FIG. 1A, folding device 100 includes a first assembly 102, second assembly 104, continuous display 106, and hinge 108 connecting first assembly 102 and second assembly 104. First assembly 102 and second assembly 104 may be rotatably connected to hinge 108. Each of first assembly 102 and second assembly 104 may include an inner surface and an outer surface. The outer surface of first assembly 102 may be visible when looking up at folding device 100 in the z-axis and the outer surface of second assembly 104 may be visible when looking up at device 100 in the z-axis. The inner surfaces of first assembly 102 and second assembly 104 may not be externally visible when folding device 100 is closed. As further shown in FIG. 1, when folding device 100 is fully open, an inner surface of a first assembly 102 is coplanar with an inner surface of a second assembly 104.

Folding device 100 may include a continuous display 106 that spans at least a portion of the interior of folding device 100. Continuous display 106 may be a display that is capable of rendering data into images viewable by a user of device 100. For example, continuous display 106 may include a matrix of pixels that are individually controllable. Examples of continuous display 106 include, but are not limited to, displays having emitting/emissive elements such as light emitting diode (LED) displays, organic light-emitting diode (OLED) displays, micro light-emitting diode (microLED) displays, electronic ink (e-ink) displays, or similar monochrome or color displays capable of outputting visible information to a user of device 100. Continuous display 106 may be flexible and capable of being shaped without damage to the display. In addition, continuous display may span both first assembly 102 and second assembly 104 across hinge 108. For instance, continuous display 106 may cover a majority of the inner surfaces of first assembly 102 and second assembly 104.

In some examples, folding device 100 may include one or more displays in addition to continuous display 106. For instance, device 100 may include a first additional display on the outer surface of first assembly 102. In some examples, folding device 100 may further include a second additional display on the outer surface of second assembly 104.

Folding device 100 includes flexible region 110. Flexible region 110 may be a region of continuous display 106 that bends and otherwise changes shape to enable folding device 100 to open and close. For example, flexible region 110 may include a portion of continuous display 106 that changes from a planar shape to a curved shape when folding device 100 is closed. Flexible region 110 may bend or otherwise change shape along an axis consistent with hinge 108.

Folding device 100 may include a mechanical hinge such as hinge 108 that rotatably connects first assembly 102 and second assembly 104. Hinge 108 may include one or more mechanical components such as mechanical moving joints. Hinge 108 may enable first assembly 102 and second assembly 104 to rotate towards each other and terminate in a closed position of folding device 100. For example, when folding device 100 is being adjusted from a closed position to an open position, hinge 108 may facilitate the adjustment of the position of folding device 100 and the positions of first assembly 102 and second assembly 104 relative to each other. Continuous display 106 may overlay (looking down at folding device 100 along the z-axis) hinge 108.

Folding device 100 includes flex cable 112. Flex cable 112 may include one or more cables, such as a ribbon cable, that interconnect one or more components of first assembly 102 and second assembly 104. For example, flex cable 112 may communicatively connect a daughterboard of second assembly 104 with a motherboard of first assembly 102. Flex cable 112 may transport any combination of power and data signals. As one example, flex cable 112 may transport DC power signals generated using power from a battery contained within first assembly 102 to operate components contained within second assembly 104. As another example, flex cable 112 may transport data signals (e.g., analog data signals and or digital data signals, such as using a MIPI, I2C, or other interface) between components contained within first assembly 102 and second assembly 104.

Flex cable 112 may run through flexible region 110. Flex cable 112 may run through flexible region 110 and around one or more components of hinge 108 in flexible region 110. For example, flex cable 112 may be threaded through one or more components of hinge 108.

Flexible region 110 may include limited space for hinge 108, flex cable 112, and other components necessary for sealing flexible region 110 against water and dust intrusion. Due to the delicate nature of the components within flexible region 110, flexible region 110 may require one or more sealing components, such as gaskets, to prevent the intrusion of foreign matter (e.g., liquids, dust, debris, etc.) and potential damage to the delicate components. However, the addition of these components may reduce the available space within flexible region 110 and increase the costs of manufacturing folding device 100.

In accordance with the aspects of this disclosure, flexible region 110 includes a flex cable holder and a fixer component that abuts flex cable 112 and an adhesive filler. Flexible region 110 may include a flex cable holder, a fixer component, and an adhesive filler for each of first assembly 102 and second assembly 104. For example, first assembly 102 may include a flex cable holder, a fixer component, and an adhesive filler located within a portion of first assembly 102.

The flex cable holder may be a nonplanar component of folding device 100 that supports flex cable 112. The flex cable holder may include one or more bended and planar sections. For example, the flex cable holder may include a planar section and a section that includes multiple folds. The flex cable holder may support flex cable 112 along a side of flex cable 112 that is abutted by the flex cable holder. For example, the flex cable holder may prevent flex cable from flexing in the direction of the flex cable holder.

The fixer component may be a nonplanar component of folding device 100 that supports flex cable 112. The fixer component may abut a portion of flex cable that is opposite that of the side of flex cable 112 that the flex cable holder abuts. For example, the fixer component and the flex cable holder may "sandwich" a portion of flex cable 112 between themselves.

The fixer component may include one or more hooks that matingly engage with one or more components of folding device 100. For example, the fixer component may include a hook on each end of the fixer component that engages with a lip of an internal component of an assembly of folding device 100, such as first assembly 102 or second assembly 104. The fixer component may secure flex cable 112 within folding device 100.

Folding device 100 may include an adhesive filler. The adhesive filler may be one or more types of adhesives, such as resin, epoxy, and pressure sensitive adhesives, among other types of adhesives. For example, adhesive filler may be a waterproof adhesive that is poured or injected into folding device 100. The adhesive filler may provide a dust- and water-resistant barrier for at least a portion of folding device 100. For example, the adhesive filler may provide a barrier against dust and water intrusion into hinge 108. In addition, the adhesive filler may prevent one or more components of folding device 100, such as flex cable 112, from shifting within folding device 100.

The designs of this disclosure provide one or more practical advantages. The use of the flex cable holder et al. (e.g., the fixer component, and the adhesive filler) may reduce the complexity and costs of providing dust- and water-resistance for folding device 100. For instance, the use of flex cable holder et al. may remove the need for costly and complex frame sealing for folding device 100. In addition, the use of flex cable holder, the fixer component, and the adhesive filler may reduce the complexity of assembling and repairing folding device 100. Further, the use of flex cable holder et al. may reduce strain on flex cable 112 that would result from opening and closing folding device 100.

FIG. 1B is a schematic diagram illustrating folding device 100 from a y-axis perspective and in a "closed" or "folded" state. As shown in FIG. 1B, folding device 100 includes first assembly 102, second assembly 104, continuous display 106, flexible region 110, and flex cable 112. As described above with respect to FIG. 1A, first assembly 102 and second assembly 104 may be rotatably connected to the hinge.

Flex cable 112 may be routed through one or more components of flexible region 110, such as a hinge. Flex cable 112 may be routed through the one or more components and connect components of first assembly 102 and second assembly 104. For example, flex cable 112 may connect a motherboard located in first assembly 102 with a daughterboard located in second assembly 104.

Flex cable 112 may shift within flexible region 110 when folding device 100 is folded and unfolded. For example, flex cable 112 may fold over itself when folding device 100 is in a folded state and unfold when folding device is in an unfolded state. Flex cable 112 may shift within flexible region 110 due to changes in distance between components that results from folding device 100 changing from a folded state to an unfolded state.

Flex cable 112 may be secured by one or more of the flex cable holder, the fixer component, and the adhesive filler. For example, the flex cable holder, the fixer component, and the adhesive filler may secure flex cable 112 along a portion of flexible region 110 and/or first assembly 102 and/or second 104. The flex cable holder, the fixer component, and the adhesive filler may secure flex cable 112 and prevent dust and water intrusion near flex cable 112.

Figure 2:
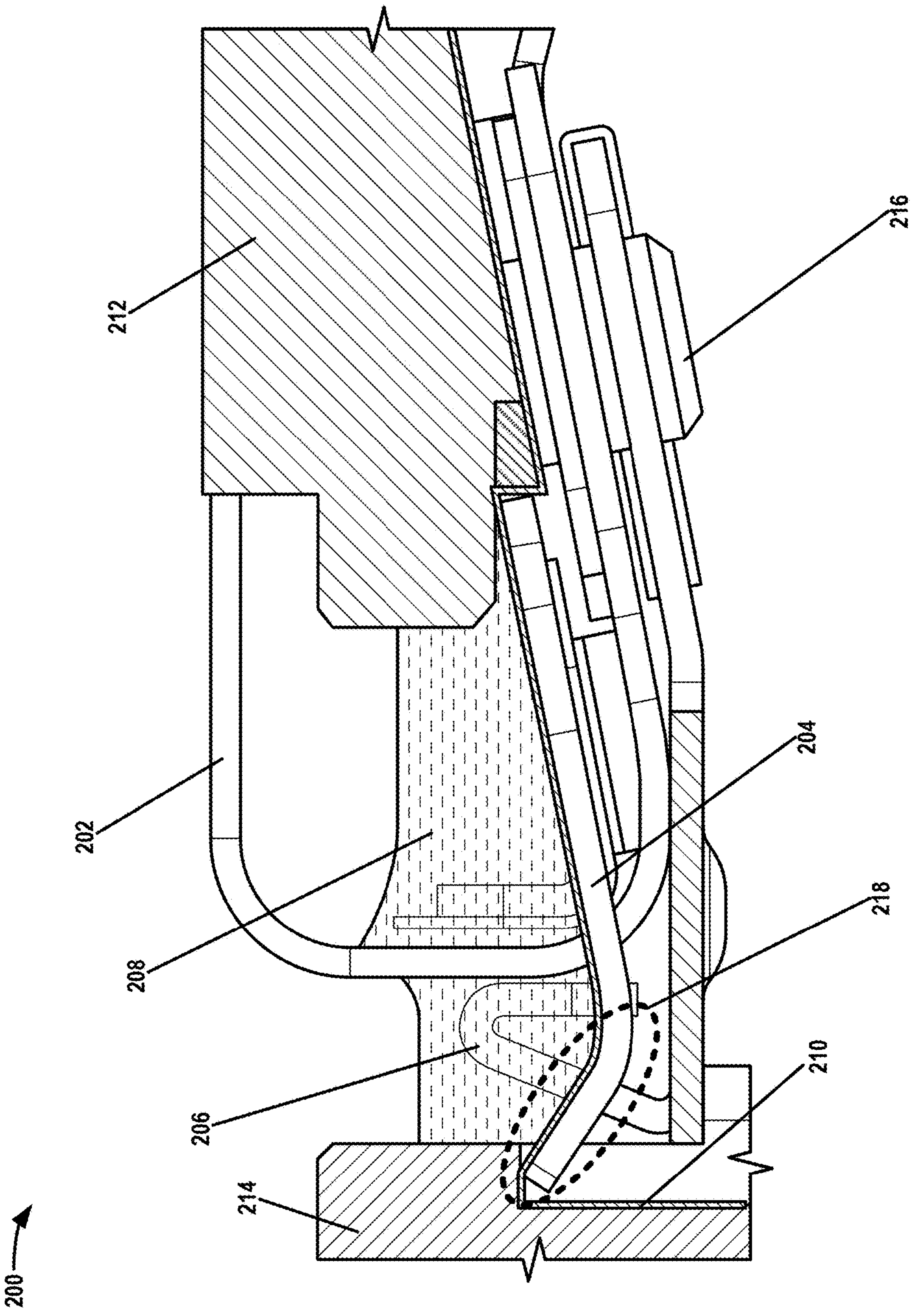
FIG. 2 is a schematic diagram illustrating a foldable display sub-assembly, in accordance with one or more aspects of this disclosure.

FIG. 2 is a schematic diagram illustrating a foldable display sub-assembly 200, in accordance with one or more aspects of this disclosure. Foldable display sub-assembly 200 may be part of a folding device, such as folding device 100 as illustrated in FIGS. 1A-1B. For example, foldable display sub-assembly 200 may be a sub-assembly of a folding assembly of foldable device 100, where foldable display sub-assembly 200 is at least partially within flexible region 110. Foldable display sub-assembly is illustrated from a y-axis perspective similar to the perspective illustrated in FIG. 1B.

Foldable display sub-assembly 200 includes flex cable 202. Flex cable 202 may be similar to flex cable 112 as illustrated in FIGS. 1A-1B and provide similar functionality. Flex cable 202 may connect one or more components between the halves of a folding device (e.g., first assembly 102 and second assembly 104 as illustrated in FIGS. 1A-1B). For example, flex cable 202 may a connect a component of first assembly 102 to a component of second assembly 104 where second assembly 104 is attached to a first side of a hinge mechanism opposite a second side of the hinge mechanism to which first assembly 102 is attached.

Side structure 214 may be part of one of the "halves" of the folding device of which foldable display sub-assembly 200 is a part (e.g., first assembly 102). Side structure 214 may be a structure, such as a support structure, that supports one or more components of the "half" of the folding device. Side structure 214 may be attached to one or more components of foldable display sub-assembly 200, such as flex cable holder 206.

Foldable display sub-assembly 200 may include flex cable holder 206. Flex cable holder may be comprised of sheet metal (e.g., steel alloys, aluminum alloys, titanium alloys, etc.) stamped into the shape of flex cable holder 206 and that guides flex cable 202. For instance, flex cable holder 206 may guide flex cable 202 by restricting the ability of flex cable 202 from bending or extending beyond the side of flex cable holder 206 that abuts flex cable 202.

Flex cable holder 206 may be attached to one or more components of foldable display sub-assembly 200 that include flex cable 202 and/or a hinge enclosure (e.g., hinge enclosure 212). For example, flex cable holder 206 may be in part adhered to a portion of flex cable 202 via an adhesive strip between flex cable holder 206 and flex cable 202. In addition, flex cable holder 206 may be at least partially retained in place by side structure 214. Flex cable holder 206 may be retained in place via a lip of side structure 214. For example, side structure 214 may include a lip that prevents flex cable holder 206 from escaping from foldable display sub-assembly 200. Flex cable holder 206 may be attached to foldable display sub-assembly 200 via one or more additional components, such as fastener 216.

Foldable display sub-assembly 200 may include fastener 216. Fastener 216 may include one or more types of components with threading along at least part of one or more sides of the component, such as screws, bolts, and other types of fasteners. For example, fastener 216 may be a helical threaded fastener that is installed in foldable display sub-assembly 200 through application of a twisting force. Fastener 216 may at least partially secure flex cable holder 206 to foldable display sub-assembly 200 via fastener 216 threaded through flex cable holder 206 and a screw boss of hinge enclosure 212.

Foldable display sub-assembly 200 may include hinge enclosure component 212. Hinge enclosure component 212 may be part of an enclosure for a hinge that facilitates the folding of the folding device that includes foldable display sub-assembly 200. For example, hinge enclosure component 212 may provide support to the hinge enclosure and connect the hinge enclosure with one or more other components of foldable display sub-assembly 200.

Foldable display sub-assembly 200 may include fixer component 204. Fixer component 204 may be a stamped sheet of metal that includes one or more metals, such as steel alloys, aluminum alloys, titanium alloys, and/or other types of materials. Fixer component 204 may include one or more slots or spaces that allow flex cable 202 to pass around/through fixer component 204 and to guide flex cable 202. For example, fixer component 204 may include a section trimmed to allow and guide flex cable 202 around fixer component 204.

Fixer component 204 may include hooks 218 (indicated by the dotted ellipse in FIG. 2) that are one or more strips of material bent or trimmed to create an edge, hook, loop, or other shape that facilitates engagement with other components of foldable display sub-assembly 200. For example, fixer component 204 may include a hook of hooks 218 at each end of fixer component 204, from the perspective of the longest side of fixer component 204 (e.g., hooks 218 located at the furthest apart ends of fixer component 204). Hooks 218 of fixer component 204 may matingly engage with one or more other components of foldable display sub-assembly 200, such as a lip or engagement point of side structure 214.

Fixer component 204 may provide a guide for flex cable 202 by itself and/or in combination with flex cable holder 206. The sides of fixer component 204 and flex cable holder 206 may provide a channel with "walls" that are the sides of flex cable holder 206 and fixer component 204 that abut flex cable 202. Flex cable holder 206 and fixer component 204 may prevent flex cable 202 from flexing or bending in an unwanted direction within folding display assembly 200 and guide flex cable 202. Other components of foldable display sub-assembly 200, such as adhesive filler 208, may retain, guide, or otherwise impede the movement of flex cable 202.

Foldable display sub-assembly 200 may include adhesive filler 208. Adhesive filler 208 may include one or more types of adhesives, such as resin, epoxy, and pressure sensitive adhesives, among other types of adhesives. For example, adhesive filler 208 may be a waterproof adhesive that is poured or injected into foldable display sub-assembly 200. Adhesive filler 208 may secure one or more components of foldable display sub-assembly 200, such as flex cable holder 206, fixer component 204, and/or flex cable 202, in place once applied. For example, adhesive filler 208 may envelop a portion of flex cable 202 and resist flexing of that portion of flex cable 202. In addition, adhesive filler 208 may prevent rubbing between flex cable holder 206 and internal components of foldable display sub-assembly 200 by providing a barrier between flex cable holder 206 and the internal components.

Fixer component 204 and/or adhesive filler 208 may provide barrier 210. While illustrated in FIG. 2, barrier 210 is representative of a barrier provided by at least one of fixer component 204 or adhesive filler 208 and is not in and of itself a component of foldable display sub-assembly 200. Fixer component 204 and/or adhesive filler 208 may individually or in combination provide at least a portion of barrier 210. Barrier 210 may be a barrier that prevents intrusion by foreign material (e.g., sand, liquids, dust, other particulate matter, non-Newtonian fluids, etc.). For example, barrier 210 may prevent water from flowing into foldable display sub-assembly 200 (e.g., the side of foldable display sub-assembly 200 that include adhesive filler 208). In some examples, hinge enclosure 212 may provide a portion of barrier 210.

In some examples, a second sub-assembly of a folding device also includes fixer component 204, flex cable holder 206, and/or adhesive filler 208. The folding device may include one or more of fixer component 204, flex cable holder 206, and/or adhesive filler 208 in both halves of the folding device, with flex cable 202 connecting the two halves. In addition, the two halves of the folding device may be attached to corresponding sides of a hinge mechanism of the folding device.

Figure 3A:
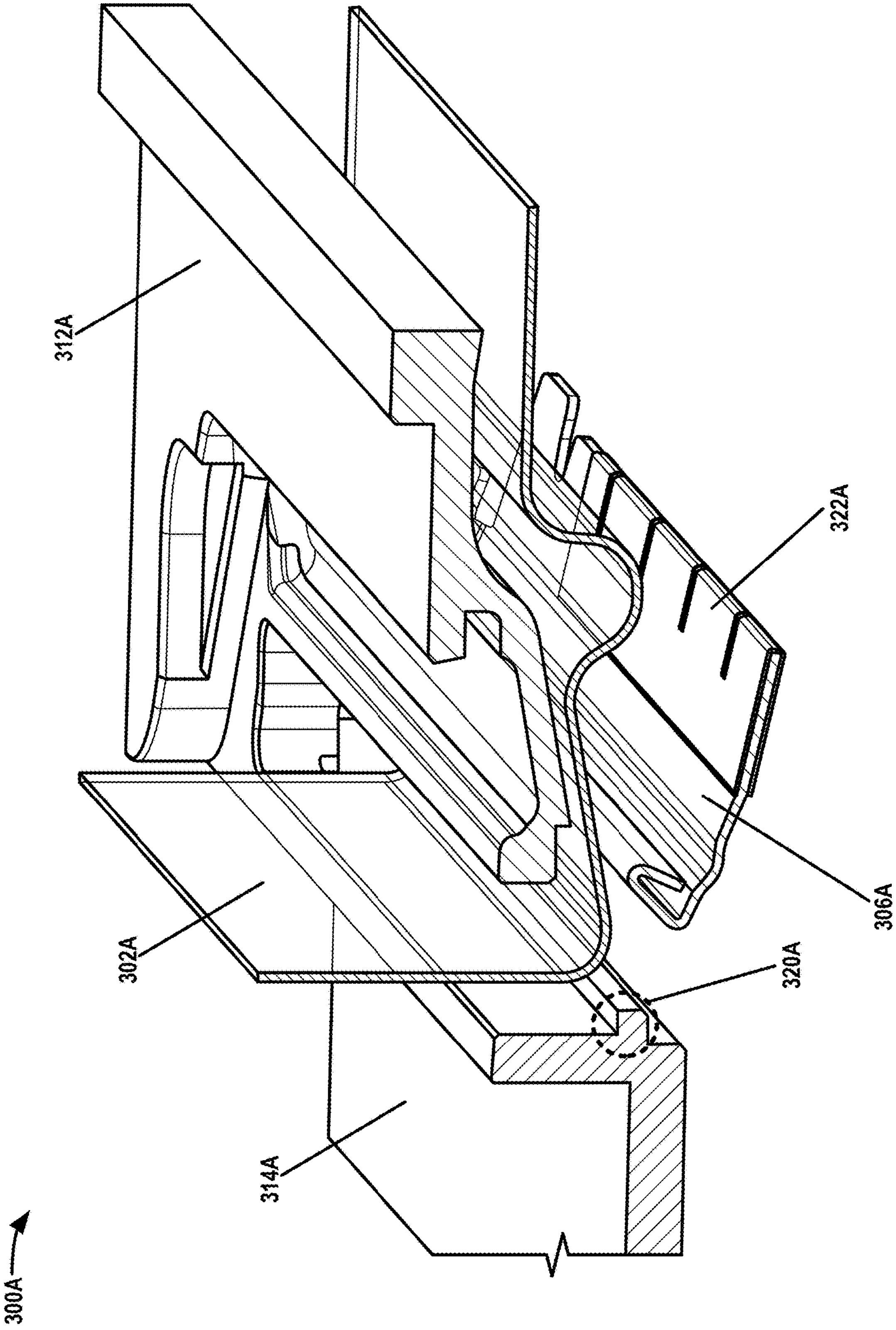
FIGS. 3A-3C are schematic diagrams illustrating foldable display sub-assemblies, in accordance with one or more aspects of this disclosure.
Figure 3B:
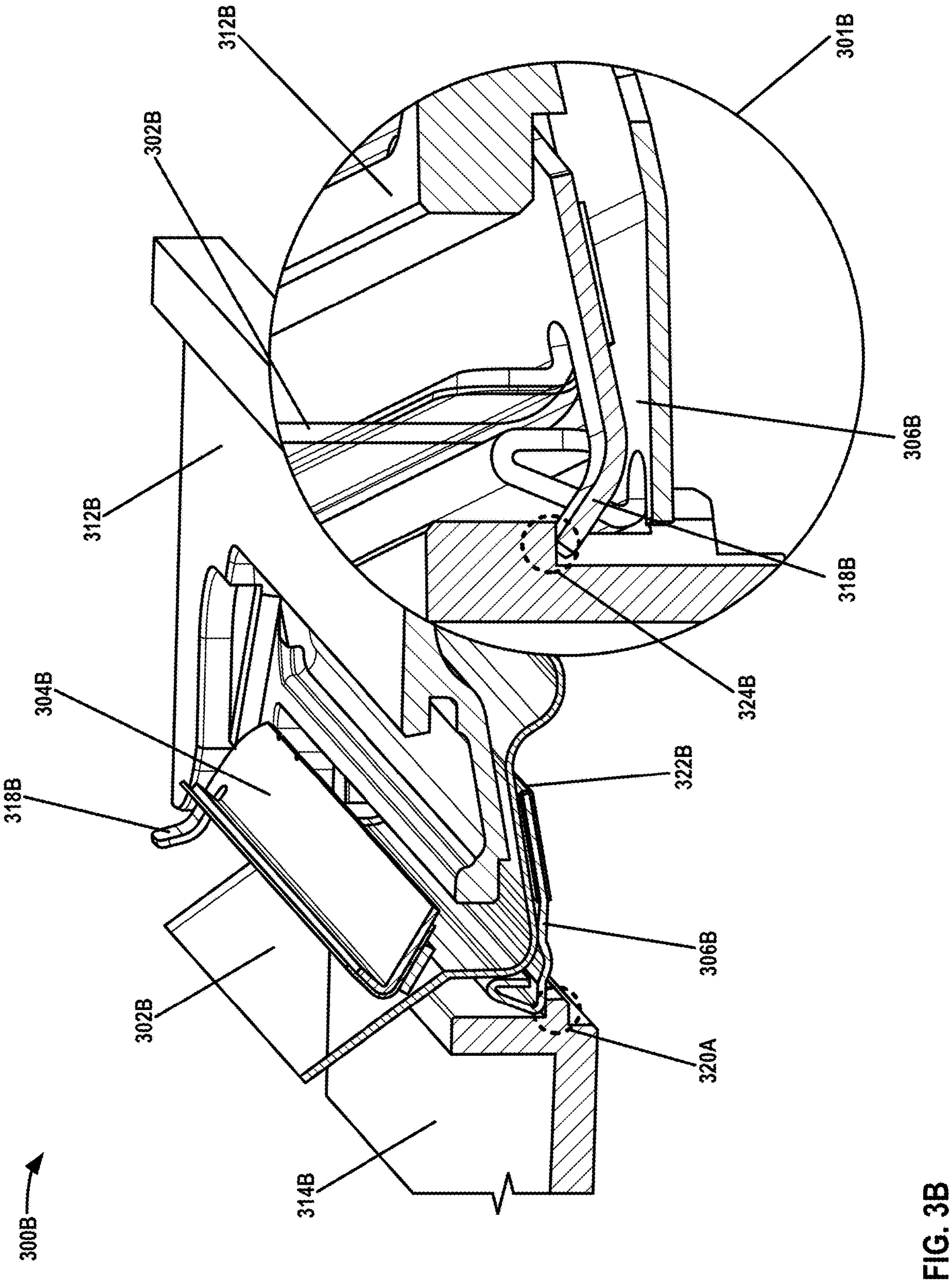
Figure 3C:
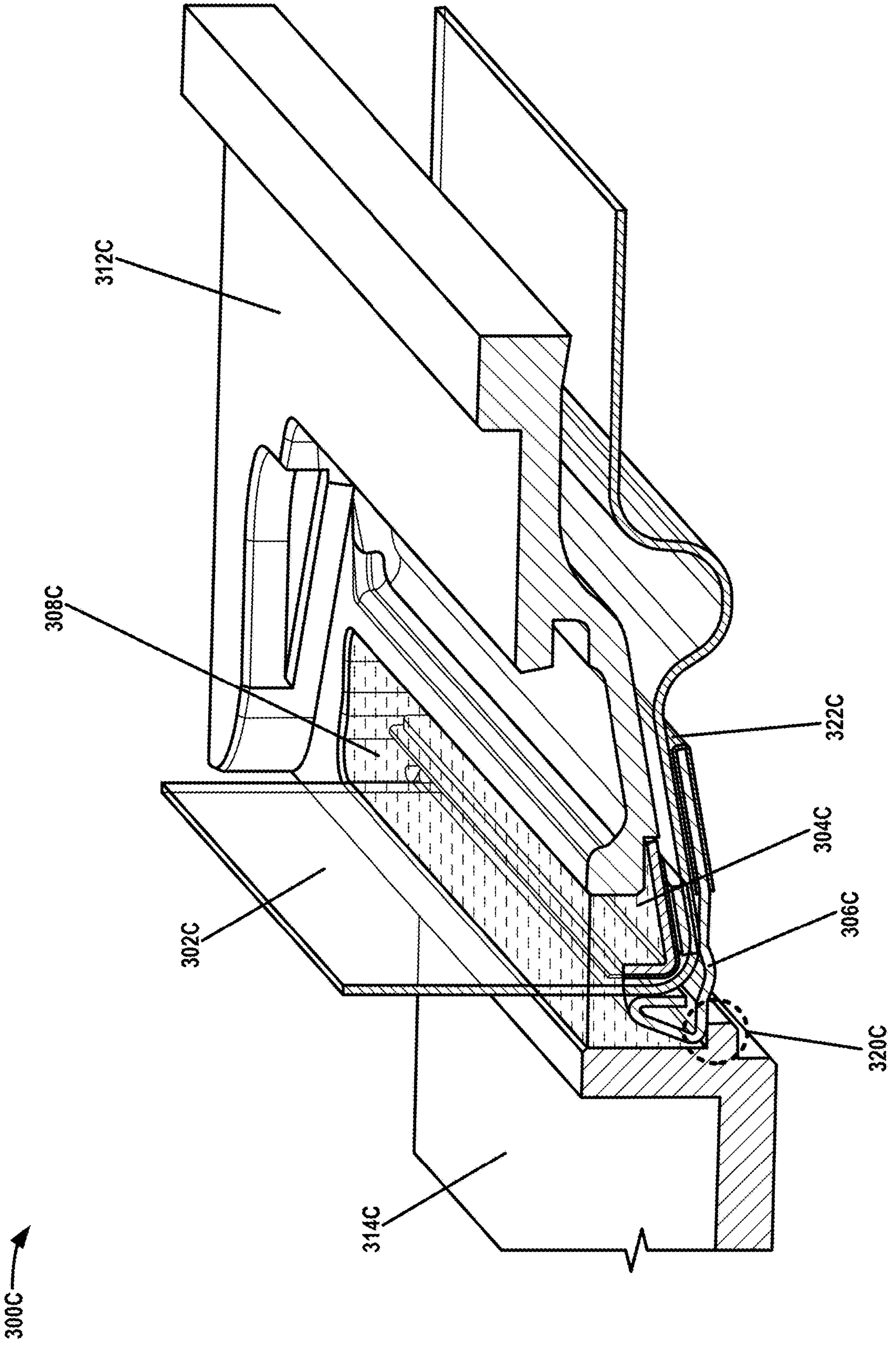

FIGS. 3A-3C are schematic diagrams illustrating foldable display sub-assemblies, in accordance with one or more aspects of this disclosure. FIGS. 3A-3C may illustrate one or more stages in an assembly process of a foldable display sub-assembly. For instance, FIG. 3A illustrates foldable display sub-assembly 300A, which may be similar to foldable display sub-assembly 200 as illustrated in FIG. 2. In some examples, one or more components of the foldable display sub-assemblies may be included in a kit.

Foldable display sub-assembly 300A includes hinge enclosure 312A and side structure 314A, which may be similar to hinge enclosure 212 and side structure 214 as illustrated in FIG. 2, respectively. Hinge enclosure 312A may be part of a hinge enclosure of the foldable device that includes foldable display assembly 300A. Side structure 314A may be part of one of the halves of the foldable device (e.g., part of first assembly 102).

Side structure 314A may include one or more lips or edges, such as lip 320A (indicated by the dotted circle in FIG. 3A). Lip 320A may be a protrusion from a side of side structure 314 that runs along at least a portion of the side of side structure 314 and include one or more components of various shapes, such as rectangles, hooks, trimmed edges, and/or other shapes. For instance, lip 320A may be a portion of side structure 314A that is extruded to enable one or more components of foldable display sub-assembly 300A to matingly engage with side structure 314A.

Foldable display sub-assembly 300A includes flex cable 302A. Flex cable 302A may be similar to flex cable 202 as illustrated in FIG. 2 and provide similar functionality. For example, flex cable 302A may interconnect the two halves of a folding device that include foldable display sub-assembly 300A. Flex cable 302A may bend or flex around components of foldable display sub-assembly 300A, such as flex cable holder 306A. Flex cable 302A may be installed in foldable display sub-assembly 300A prior to the installation of flex cable holder 306A.

Foldable display sub-assembly 300A may include flex cable holder 306A. Flex cable holder 306A may be similar to flex cable holder 206 as illustrated in FIG. 2 and provide similar functionality. For example, flex cable holder 306A may be a stamped sheet of metal with one or more folds and that guides flex cable 302A through foldable display sub-assembly 300A.

Flex cable holder 306A may be installed in foldable display sub-assembly 300A. An assembler may install flex cable holder in foldable display sub-assembly 300A by inserting flex cable holder 306A into foldable display sub-assembly 300A such that a portion of flex cable holder 306A abuts a lip of side structure 314A, such as lip 320A. When inserted, lip 320A may resist the movement of flex cable holder 306A out of foldable display sub-assembly 300A. In addition, a fastener (not illustrated), such as fastener 216 as illustrated in FIG. 2, may secure flex cable holder 306A to foldable display sub-assembly 300A.

Flex cable holder 306A may include adhesive 322A. Adhesive 322A may include one or more types of adhesive, such as adhesive strips, acrylic foam tape, pressure sensitive adhesive (PSA), and/or other types of adhesives along at least a portion of one or more sides of flex cable holder 306A. When flex cable holder 306A is installed in foldable display sub-assembly 300A, adhesive 322A may adhere to flex cable 302A and secure flex cable 302A to at least a portion of flex cable holder 306A.

FIG. 3B illustrates foldable display sub-assembly 300B. Foldable display sub-assembly 300B may be a representation of foldable display 300A with flex cable holder 306A installed. FIG. 3B includes installation view 301B.

Foldable display sub-assembly 300B includes hinge enclosure 312B and side structure 314B, which may be similar to hinge enclosure 212 and side structure 214 as illustrated in FIG. 2, respectively. Hinge enclosure 312B may be part of a hinge enclosure of the foldable device that includes foldable display sub-assembly 300B. Side structure 314B may be part of one of the halves of the foldable device (e.g., part of first assembly 102).

Foldable display sub-assembly 300B may include flex cable holder 306B. Flex cable holder 306B may be a representation of flex cable holder 306A in an installed configuration. When installedFlex cable holder 306B may provide a guide for flex cable 302B by abutting a side of flex cable 302B and restricting the movement of flex cable 302B in one or more directions. In addition, flex cable holder 306B may be at least partially adhered to flex cable 302B by adhesive 322B, which may be similar to adhesive 322A.

As illustrated in FIG. 3B, a component of side structure 314B, such as lip 320B, may retain flex cable holder 306B. Lip 320B may be a component of side structure 314B similar to lip 320A as illustrated in FIG. 3A. For example, lip 320B may impede the movement of flex cable holder 306B from exiting foldable display sub-assembly 300B.

Foldable display sub-assembly 300B includes fixer component 304B. Fixer component 304B may be similar to fixer component 204 as illustrated in FIG. 2 and provide similar functionality. For example, fixer component 304B may be a sheet of stamped metal, such as steel alloy. Fixer component 304B may provide a guide for flex cable 302B. Fixer component 304B may abut a side of flex cable 302B and impede the movement of flex cable 302B in a direction consistent with fixer component 304B.

Fixer component 304B may include one or more of hooks 318B. Hooks 318B may be similar to hooks 218 as illustrated in FIG. 2 and provide similar functionality. For example, hooks 318B may be a component of fixer component 304B. Hooks 318B may include one or more types of components, such as strips, trimmed shapes, edges, hooks, loops, or other shapes that facilitates engagement. Hooks 318B may engage with one or more components of foldable display sub-assembly 300B, such as engagement points 324B as shown in view 301B.

View 301B may be a magnified view of a portion of foldable display sub-assembly 300B. View 301B may illustrate foldable display sub-assembly 300B with fixer component 304B fully inserted into foldable display 300B. FIG. 3B may illustrate fixer component 304B as partially inserted outside of view 301B and fixer component 304B as fully inserted within view 301B. In addition, view 301B may illustrate components not shown in the rest of FIG. 3, such as engagement points 324B.

Side structure 314B may include engagement points 324B (indicated by the dashed circle within view 301B). Engagement points 324B may be a component of side structure 314B, such as a lip, edge, loop, or other type of engagement point that enable hooks 318B of fixer component 304B to engage with side structure 314B and impede movement of fixer component 304B. In an example, an assembler inserts fixer component 304B into foldable display sub-assembly 300B. Hooks 318B engage with engagement points 324B and impede movement of fixer component 304B.

Fixer component 304B and flex cable holder 306B may provide a guide for flex cable 302. The sides of fixer component 304B and flex cable holder 306B that abut flex cable 302 may act as "walls" in a channel that prevents flex cable 302B from bending or flexing beyond the sides of fixer component 304B and flex cable holder 306B. For example, the sides of fixer component 304B and flex cable holder 306B may limit the movement of flex cable 302B and ensure that flex cable 302B stays within the boundaries formed by the sides of fixer component 304B and flex cable holder 306B.

FIG. 3C illustrates foldable display sub-assembly 300C. Foldable display sub-assembly 300B may be a representation of foldable display 300A with fixer component 304C, flex cable holder 306C, and adhesive filler 308C installed.

Foldable display sub-assembly 300C includes hinge enclosure 312C and side structure 314C, which may be similar to hinge enclosure 212 and side structure 214 as illustrated in FIG. 2, respectively. Hinge enclosure 312C may be part of a hinge enclosure of the foldable device that includes foldable display sub-assembly 300C. Side structure 314C may be part of one of the halves of the foldable device (e.g., part of first assembly 102).

Foldable display sub-assembly 300C may include fixer component 304C. Fixer component 304C may be a representation of fixer component 304B as illustrated in FIG. 3B. For example, fixer component 304C may be a sheet of stamped metal that is engaged with side structure 314C and includes adhesive 322C that adheres to flex cable 302.

Foldable display sub-assembly 300C may include flex cable holder 306C. Flex cable holder 306C may be a representation of fixer component 304B as illustrated in FIG. 3B. For example, flex cable holder 306C may be a sheet of stamped metal with one or more hooks that are engaged with side structure 314C, such as lip 320C.

Foldable display sub-assembly 300C includes adhesive filler 308C. Adhesive filler 308C may be similar to adhesive filler 208 and provide similar functionality. For example, adhesive filler 308C may include one or more types of adhesives, such as resin, epoxy, and pressure sensitive adhesives, among other types of adhesives.

Adhesive filler 308C may envelop one or more components of foldable display sub-assembly 300C and secure one or more components of foldable display sub-assembly 300C. For example, adhesive filler 308C may envelop a side of flex cable holder 306C and a side of fixer component 304C. Adhesive filler 308C may secure components of folding display 300C by impeding movement of components of foldable display 300C. For example, adhesive filler 308C may impede the movement of the portions of flex cable 302 that are enveloped in adhesive filler 308C.

Fixer component 304C and/or adhesive filler 308C may provide a barrier against the intrusion of foreign material into foldable display sub-assembly 300C. Fixer component 304C and/or adhesive filler 308C may provide a barrier, such as barrier 210 as illustrated in FIG. 2, against the intrusion of foreign material, such as liquids, particulate matter, and/or other types of foreign material into foldable display sub-assembly 300C. Fixer component 304C and/or adhesive filler 308C may provide a barrier independently of each other and/or in conjunction with each other.

A disassembler may disassemble at least a portion of foldable display sub-assembly 300C. The disassembler may disassemble foldable display sub-assembly 300C in a different order than that of the opposite of the assembly process illustrated in FIGS. 3A-3C and described in FIG. 4. For example, fixer component 304C may require the removal of flex cable 302C and flex cable holder 306C before removal.

The disassembler may remove adhesive filler 308C. Adhesive filler 308C may enable the disassembler to remove adhesive filler 308C via mechanical means and/or chemical means. For example, the disassembler may remove adhesive filler 308C using a solvent.

The disassembler may remove flex cable holder 306C. The disassembler may remove flex cable holder 306C following the removal of adhesive filler 308C. Flex cable holder 306C may require detachment of adhesive 322C from flex cable 302C prior to removal of flex cable holder 306C. In an example, the disassembler detaches adhesive 322C from flex cable 302C. The dissembler detaches flex cable holder 306C from lip 320C by angling the portion of flex cable holder 306C furthest from lip 320C away from foldable display sub-assembly 300C. The disassembler may uninstall flex cable holder 306C prior to fixer component 304C.

The disassembler may remove flex cable 302C from foldable display sub-assembly 300C. The disassembler may remove flex cable 302C by threading flex cable 302C through a gap in foldable display sub-assembly 300C left by the removal of flex cable holder 306C from foldable display sub-assembly 300C. For example, the disassembler may feed flex cable 302C through foldable display sub-assembly 300C after disconnecting flex cable 302C from one or more ports.

The dissembler may remove fixer component 304C from foldable display sub-assembly 300C. The disassembler may remove fixer component 304C by releasing hooks 318C and removing fixer component 304C in the same direction of flex cable holder 306C. For example, the disassembler may remove fixer component 304C orientating the side of fixer component 304C furthest from hooks 318C down and away from foldable display sub-assembly 300C.

FIG. 4 is a flow chart illustrating an assembly of a folding device, in accordance with one or more aspects of this disclosure. For the purposes of clarity, FIG. 4 is described in the context of FIG. 2.

An assembler attaches a flex cable holder, such as flex cable holder 206, to an internal portion of a first assembly, such foldable display sub-assembly 200, to a first side of a flex cable, such as flex cable 202, where the flex cable runs through a hinge mechanism attached between foldable display sub-assembly 200 and a second assembly that are assemblies of a foldable display assembly (400). Flex cable holder 206 may be attached to the internal portion of foldable display sub-assembly 200 via fastener 316 and/or a lip, such as lip 320A as illustrated in FIG. 3A. In some examples, flex cable holder 206 may include adhesive that abuts the first side of flex cable 202. Flex cable holder 206 may retain and impede movement of flex cable 202. For example, flex cable holder 206 may impede flex cable 202 from flexing or bending in a direction consistent with the side of flex cable 202 that abuts flex cable holder 206.

The assembler attaches a fixer component, such as fixer component 204, that includes one or more hooks, such as hooks 218, as abutting a second side of flex cable 202 opposite that of the first side, where attaching includes matingly engaging the hooks 218 within the internal portion of foldable display sub-assembly 200 (402). Hooks 218 of fixer component 204 may matingly engage with a component of foldable display sub-assembly 200, such as engagement point 324B as illustrated in FIG. 3B and impede movement of fixer component 204. Fixer component 204 and flex cable holder 206 may individually or in combination impede movement of flex cable 202.

The assembler applies an adhesive filler, such as adhesive filler 208, to a space between flex cable holder 206, fixer component 204, and at least part of the internal portion of foldable display sub-assembly 200. Adhesive filler 208 may impede the movement of one or more components of foldable display sub-assembly 200. For example, adhesive filler 208 may prevent the movement of flex cable 202, flex cable holder 206, and/or fixer component 204. Adhesive filler 208 may provide a barrier against the intrusion of foreign material into foldable display sub-assembly 200 by itself or in combination with other components of foldable display sub-assembly 200, such as fixer component 204. For example, adhesive filler 208 and fixer component 204 may provide barrier 210 that is a barrier against the intrusion of liquids and particulate matter into foldable display sub-assembly 200.

Example 1: A foldable display assembly includes a first assembly; a second assembly; a hinge mechanism attached between the first assembly and the second assembly; a flexible display connected to the first assembly and the second assembly, the flexible display spanning the hinge mechanism; a flex cable that runs between the first assembly and the second assembly through the hinge mechanism; a flex cable holder attached to an internal portion of the first assembly and to a first side of the flex cable; a fixer component that includes one or more hooks matingly engaged within the internal portion of the first assembly, wherein the fixer component abuts a second side of the flex cable opposite that of the first side; and an adhesive filler applied to a space between the flex cable holder, the fixer component, the flex cable, and at least part of the internal portion of the first assembly.

Example 2: The foldable display assembly of example 1, wherein the second assembly is attached to a first side of the hinge mechanism opposite a second side of the hinge mechanism to which the first assembly is attached, and wherein the flex cable connects a component of the first assembly with a component of the second assembly.

Example 3: The foldable display assembly of example 1, wherein the second assembly includes a second flex cable holder, a second fixer component, and a second adhesive filler.

Example 4: The foldable display assembly of example 1, wherein the adhesive filler envelops a portion of the flex cable and resists flexing of the enveloped portion of the flex cable.

Example 5: The foldable display assembly of example 1, wherein the adhesive filler provides a buffer between the flex cable holder and the internal portion of the first assembly to prevent rubbing between the flex cable holder and the internal portion of the first assembly.

Example 6: The foldable display assembly of example 1, wherein the flex cable holder provides a guide for the flex cable.

Example 7: The foldable display assembly of example 1, wherein the flex cable is installed in the foldable display assembly prior to an installation of the flex cable holder, the fixer component, and the adhesive filler.

Example 8: The foldable display assembly of example 1, wherein the flex cable holder is uninstalled from the foldable display assembly prior to the fixer component during a disassembly of the foldable display assembly.

Example 9: The foldable display assembly of example 1, wherein a combination of the fixer component and the adhesive filler provide a sealing boundary along a portion of the first assembly.

Example 10: The foldable display assembly of example 1, wherein the flex cable holder is comprised of sheet metal.

Example 11: A method includes attaching, by an assembler, a flex cable holder to an internal portion of a first assembly and to a first side of a flex cable, wherein the flex cable runs through a hinge mechanism attached between the first assembly and a second assembly that are assemblies of a foldable display assembly; attaching, by the assembler, a fixer component that includes one or more hooks as abutting a second side of the flex cable opposite that of the first site, wherein attaching include matingly engaging the one or more hooks within the internal portion of the first assembly; and applying, by the assembler, an adhesive filler to a space between the flex cable holder, the fixer component, and at least part of the internal portion of the first assembly.

Example 12: The method of example 11, further includes stamping sheet metal into a shape of the fixer component.

Example 13: The method of example 11, wherein the second assembly is attached to a first side of the hinge mechanism opposite a second side of the hinge mechanism to which the first assembly is attached, and wherein the flex cable connects a component of the first assembly with a component of the second assembly.

Example 14: The method of example 11, wherein the second assembly includes a second flex cable holder, a second fixer component, and a second adhesive filler.

Example 15: The method of example 11, further includes removing, by the assembler, the flex cable holder; and removing, by the assembler and in response to the removal of the flex cable holder, the fixer component.

Example 16: A kit for securing a flex cable within a foldable display assembly includes a first assembly; a second assembly; a flexible display spanning at least a portion of the first assembly and a portion of the second assembly; a hinge mechanism attached between the first assembly and the second assembly; a flex cable that run between the first assembly and the second assembly through the hinge mechanism; a flex cable holder to be attached to an internal portion of the first assembly and to a first side of the flex cable; a fixer component that includes one or more hooks positioned to matingly engage within the internal portion of the first assembly and to cause the fixer component to abut a second side of the flex cable opposite that of the first side; and an adhesive filler to be applied to a space between the flex cable holder, the fixer component, the flex cable, and at least part of the internal portion of the first assembly.

Example 17: The kit of example 16, wherein the second assembly is attached to a first side of the hinge mechanism opposite a second side of the hinge mechanism to which the first assembly is attached, and wherein the flex cable connects a component of the first assembly with a component of the second assembly.

Example 18: The kit of example 16, wherein the second assembly includes a second flex cable holder, a second fixer component, and a second adhesive filler.

Example 19: The kit of example 16, wherein the flex cable holder, the fixer component, and the adhesive filler prevent flexing of a portion of the flex cable.

Example 20: The kit of example 16, wherein the flex cable holder provides a guide for the flex cable.

Various aspects have been described in this disclosure. These and other aspects are within the scope of the following claims.

The invention claimed is:

1. A foldable display assembly, comprising:

a first assembly;

a second assembly;

a hinge mechanism attached between the first assembly and the second assembly;

a flexible display connected to the first assembly and the second assembly, the flexible display spanning the hinge mechanism;

a flex cable that runs between the first assembly and the second assembly through the hinge mechanism;

a flex cable holder attached to an internal portion of the first assembly and to a first side of the flex cable;

a fixer component that includes one or more hooks matingly engaged within the internal portion of the first assembly, wherein the fixer component abuts a second side of the flex cable opposite that of the first side; and an adhesive filler applied to a space between the flex cable holder, the fixer component, the flex cable, and at least part of the internal portion of the first assembly.

2. The foldable display assembly of claim 1, wherein the second assembly is attached to a first side of the hinge mechanism opposite a second side of the hinge mechanism to which the first assembly is attached, and wherein the flex cable connects a component of the first assembly with a component of the second assembly.

3. The foldable display assembly of claim 1, wherein the second assembly includes a second flex cable holder, a second fixer component, and a second adhesive filler.

4. The foldable display assembly of claim 1, wherein the adhesive filler envelops a portion of the flex cable and resists flexing of the enveloped portion of the flex cable.

5. The foldable display assembly of claim 1, wherein the adhesive filler provides a buffer between the flex cable holder and the internal portion of the first assembly to prevent rubbing between the flex cable holder and the internal portion of the first assembly.

6. The foldable display assembly of claim 1, wherein the flex cable holder provides a guide for the flex cable.

7. The foldable display assembly of claim 1, wherein the flex cable is installed in the foldable display assembly prior to an installation of the flex cable holder, the fixer component, and the adhesive filler.

8. The foldable display assembly of claim 1, wherein the flex cable holder is uninstalled from the foldable display assembly prior to the fixer component during a disassembly of the foldable display assembly.

9. The foldable display assembly of claim 1, wherein a combination of the fixer component and the adhesive filler provide a sealing boundary along a portion of the first assembly.

10. The foldable display assembly of claim 1, wherein the flex cable holder is comprised of sheet metal.

11. A method, comprising:

attaching, by an assembler, a flex cable holder to an internal portion of a first assembly and to a first side of a flex cable, wherein the flex cable runs through a hinge mechanism attached between the first assembly and a second assembly that are assemblies of a foldable display assembly;

attaching, by the assembler, a fixer component that includes one or more hooks as abutting a second side of the flex cable opposite that of the first side, wherein attaching include matingly engaging the one or more hooks within the internal portion of the first assembly; and applying, by the assembler, an adhesive filler to a space between the flex cable holder, the fixer component, and at least part of the internal portion of the first assembly.

12. The method of claim 11, further comprising:

stamping sheet metal into a shape of the fixer component.

13. The method of claim 11, wherein the second assembly is attached to a first side of the hinge mechanism opposite a second side of the hinge mechanism to which the first assembly is attached, and wherein the flex cable connects a component of the first assembly with a component of the second assembly.

14. The method of claim 11, wherein the second assembly includes a second flex cable holder, a second fixer component, and a second adhesive filler.

15. The method of claim 11, further comprising:

removing, by the assembler, the flex cable holder; and removing, by the assembler and in response to the removal of the flex cable holder, the fixer component.

16. A kit for securing a flex cable within a foldable display assembly, the kit comprising:

a first assembly;

a second assembly;

a flexible display spanning at least a portion of the first assembly and a portion of the second assembly;

a hinge mechanism attached between the first assembly and the second assembly;

a flex cable that run between the first assembly and the second assembly through the hinge mechanism;

a flex cable holder to be attached to an internal portion of the first assembly and to a first side of the flex cable;

a fixer component that includes one or more hooks positioned to matingly engage within the internal portion of the first assembly and to cause the fixer component to abut a second side of the flex cable opposite that of the first side; and an adhesive filler to be applied to a space between the flex cable holder, the fixer component, the flex cable, and at least part of the internal portion of the first assembly.

17. The kit of claim 16, wherein the second assembly is attached to a first side of the hinge mechanism opposite a second side of the hinge mechanism to which the first assembly is attached, and wherein the flex cable connects a component of the first assembly with a component of the second assembly.

18. The kit of claim 16, wherein the second assembly includes a second flex cable holder, a second fixer component, and a second adhesive filler.

19. The kit of claim 16, wherein the flex cable holder, the fixer component, and the adhesive filler prevent flexing of a portion of the flex cable.

20. The kit of claim 16, wherein the flex cable holder provides a guide for the flex cable.

* * * * *